(12) United States Patent
Inoue et al.

(10) Patent No.: US 8,056,026 B2
(45) Date of Patent: Nov. 8, 2011

(54) DETERMINING MANUFACTURABILITY OF LITHOGRAPHIC MASK BY SELECTING TARGET EDGE PAIRS USED IN DETERMINING A MANUFACTURING PENALTY OF THE LITHOGRAPHIC MASK

(75) Inventors: Tadanobu Inoue, Kanagawa-ken (JP); David O. Melville, New York, NY (US); Hidemasa Muta, Tokyo-to (JP); Kehan Tian, Poughkeepsie, NY (US); Masahura Sakamoto, Kanagawa-ken (JP); Alan E. Rosenbluth, Yorktown Heights, NY (US)

(73) Assignee: International Business Machines Corporation, Armonk ( * ) Notice: Subject to any disclaimer, the term of this patent is extended or adjusted under 35 U.S.C. 154(b) by 337 days.

(21) Appl. No.: 12/334,485

(22) Filed: Dec. 14, 2008

(65) Prior Publication Data

US 2010/0153902 A1 Jun. 17, 2010

(51) Int. Cl.
*G06F 17/50* (2006.01)
(52) U.S. Cl. ............................................. 716/54; 716/55
(58) Field of Classification Search ..................... 716/54, 716/55
See application file for complete search history.

(56) References Cited

U.S. PATENT DOCUMENTS

| | | | |
|---|---|---|---|
| 6,563,566 B2 | 5/2003 | Rosenbluth et al. | |
| 7,057,709 B2 | 6/2006 | Rosenbluth | |
| 2003/0208742 A1* | 11/2003 | LaCour | 716/21 |
| 2007/0266346 A1* | 11/2007 | Wu | 716/2 |
| 2010/0146465 A1* | 6/2010 | Berkens et al. | 716/2 |

OTHER PUBLICATIONS

A.E. Rosenbluth et al., "Optimum mask and source patterns to print a given shape," Society of photo-optical instrumentation engineers, JM3, Apr. 2002.
A.E. Rosenbluth et al., "Method for forming arbitrary lithographic wavefronts using standard mask technology," IBM disclosure YOR8-2005-0697, Oct. 4, 2007.
A.E. Rosenbluth et al., "Gobal optimization of masks, including film stack design to restore TM contrast to high NA TCC's," Proceedings—SPIE The International Society for Optical Engineering, year 2007.
A.E. Rosenbluth et al., "A method for global optimization of lithographic source intensities under contingent requirements," IBM disclosure YOR8-2007-0556, May 14, 2007.
A.E. Rosenbluth et al., "Global optimization of the illumination distribution to maximize integrated process window," Procs. of SPIE, year 2006.

* cited by examiner

*Primary Examiner* — Paul Dinh
*Assistant Examiner* — Bryce Aisaka
(74) *Attorney, Agent, or Firm* — Vazken Alexanian

(57) ABSTRACT

The manufacturability of a lithographic mask employed in fabricating instances of a semiconductor device is determined. Target edges are selected from mask layout data of the lithographic mask. The mask layout data includes polygons distributed over cells, where each polygon has edges. The cells include a center cell, two vertical cells above and below the center cell, and two horizontal cells to the left and right of the center cell. Target edge pairs are selected for determining a manufacturing penalty in making the lithographic mask, in a manner that decreases the computational volume in determining the manufacturing penalty. The manufacturability of the lithographic mask, including the manufacturing penalty in making the lithographic mask, is determined based on the target edge pairs selected. The manufacturability of the lithographic mask is output. The manufacturability of the lithographic mask is dependent on the manufacturing penalty in making the lithographic mask.

19 Claims, 7 Drawing Sheets

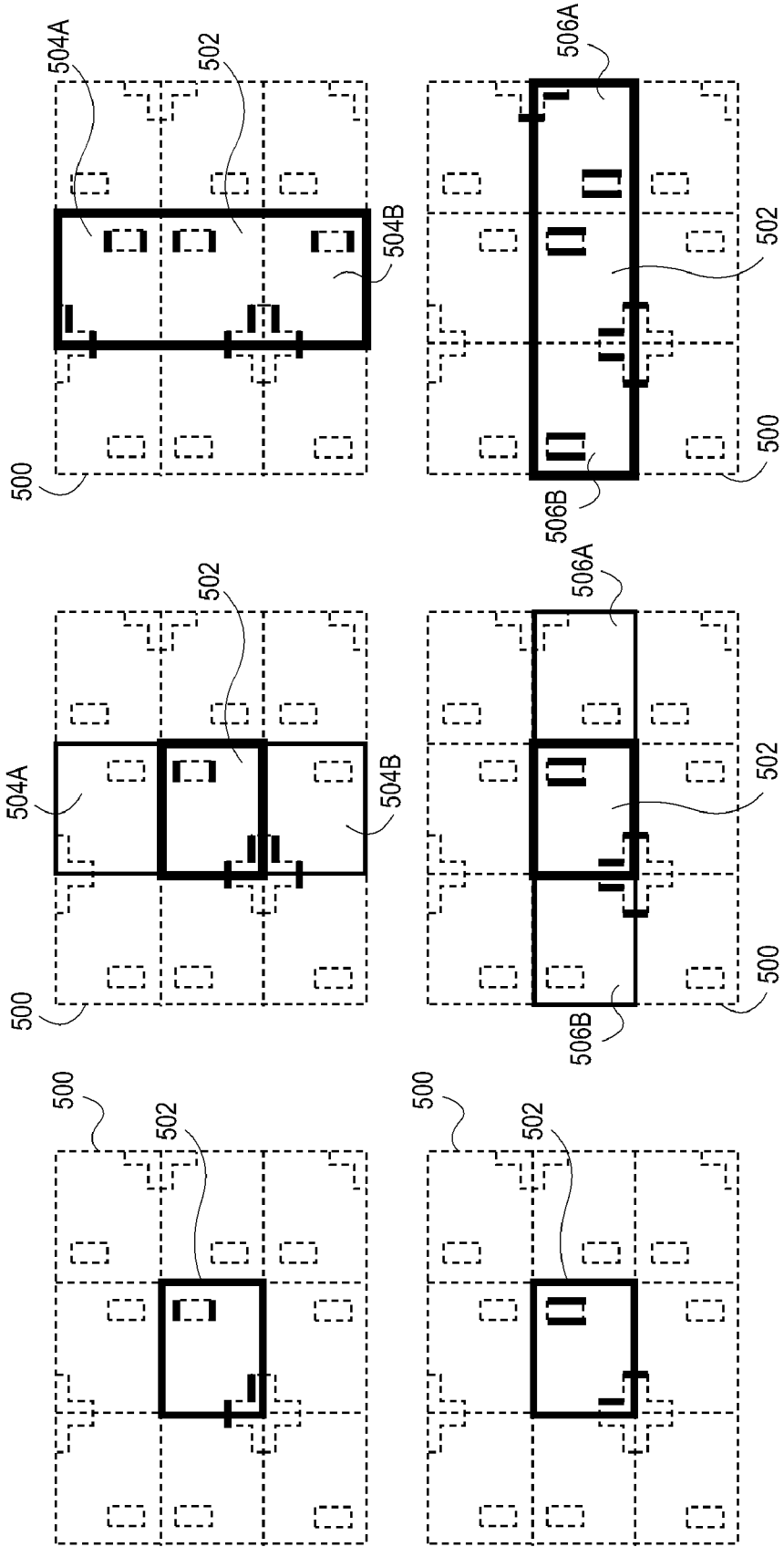

DETERMINING MANUFACTURABILITY OF LITHOGRAPHIC MASK BY SELECTING TARGET EDGE PAIRS USED IN DETERMINING A MANUFACTURING PENALTY OF THE LITHOGRAPHIC MASK

RELATED PATENT APPLICATIONS

The present patent application is related to the following patent applications, which are hereby incorporated by reference:

(1) The patent application entitled "determining manufacturability of lithographic mask by reducing target edge pairs used in determining a manufacturing penalty of the lithographic mask," filed on Dec. 14, 2008, and assigned Ser. No. 12/334,482; and, (2) The patent application entitled "determining manufacturability of lithographic mask using continuous derivatives characterizing the manufacturability on a continuous scale," filed on Dec. 14, 2008, and assigned Ser. No. 12/334,488.

FIELD OF THE INVENTION

The present invention relates generally to determining the manufacturability of a lithographic mask employed in fabricating instances of a semiconductor device, and more particularly to determining such manufacturability by selecting the target edge pairs of edges of polygons in mask layout data that are used to determine a manufacturing penalty in manufacturing the lithographic mask.

BACKGROUND OF THE INVENTION

Semiconductor devices include semiconductor processors, semiconductor memories, such as static random-access memories (SRAM's), and other types of semiconductor devices. A common semiconductor device fabrication process is photolithography. In photolithography, a semiconductor surface is selectively exposed to light through a lithographic mask. The semiconductor surface is developed, and the areas that were exposed to light (or the areas that were not exposed to light) are removed.

Therefore, to employ photolithography in fabricating instances of a given semiconductor device, a lithographic mask first has to be manufactured. However, depending on various aspects of the semiconductor device, such as its complexity, the lithographic mask can be relatively difficult (if not impossible) to manufacture, or relatively easy to manufacture. As such, it can be important to assess the manufacturability of a lithographic mask before the mask is actually made.

SUMMARY OF THE INVENTION

The present invention relates to determining the manufacturability of a lithographic mask, by purposefully selecting the target edge pairs used in determining a manufacturing penalty of the lithographic mask. A method of an embodiment of the invention determines the manufacturability of a lithographic mask that is employed in fabricating instances of a semiconductor device. The method may be implemented as one or more computer programs stored on a computer-readable medium, such as a tangible computer-readable medium like a recordable data storage medium. When executed, the computer programs perform the method.

The method selects target edges from mask layout data of the lithographic mask. The mask layout data includes a number of polygons distributed over a number of cells. Each polygon has a number of edges. The cells include a center cell, two vertical cells, and two horizontal cells. The vertical cells include an upper cell above the center cell and a lower cell below the center cell. The horizontal cells include a left cell to the left of the center cell and a right cell to the right of the center cell. The method selects the target edges as follows. First target edges are selected as the edges located at least partially within the center cell. Second target edges are selected that are at least partially within the center cell, the vertical cells, or the horizontal cells and that are part of polygons located at least partially within the center cell. Third target edges are selected that are at least partially within the center cell, the vertical cells, or the horizontal cells and that are part of polygons located at least partially within the center cell, the vertical cells, or the horizontal cells.

The method selects a number of target edge pairs for determining a manufacturing penalty in making the lithographic mask. The target edge pairs are selected in a manner that decreases the computational volume in determining the manufacturing penalty in making the mask. Each target pair includes a first edge selected from the first target edges and a second edge selected from the second target edges or the third target edges. The method determines the manufacturability of the lithographic mask, including determining the manufacturing penalty in making the mask. The manufacturing penalty is determined based on the target edge pairs as have been reduced in number. The method finally outputs the manufacturability of the lithographic mask. This manufacturability is dependent on the manufacturing penalty in making the mask.

In one embodiment, the target edge pairs are selected by performing one or more of the following (including performing all of the following in one embodiment). First, a number of first target edge pairs can be selected. Each first target edge pair includes one of the first target edges and one of the third target edges. Selecting the first target edge pairs is achieved as follows, for each first target edge. Where the first target edge is horizontal, each second target edge that is also horizontal is selected, such that the first target edge is paired with each second target edge that is horizontal to result in one or more corresponding first target edge pairs. Similarly, where the first target edge is vertical, each second target edge that is also vertical is selected, such that the first target edge is paired with each second target edge that is vertical to result in one or more corresponding first target edge pairs. Each first target edge pair relates to a manufacturing shape penalty incurred in manufacturing the lithographic mask due to a shape of a polygon including one or more of the edges of the first target edge pair.

Second, a number of second target edge pairs can be selected. Each second target edge pair includes one of the first target edges and one of the third target edges. Selecting the second target edge pairs is achieved as follows, for each first target edge. Where the first target edge is horizontal, each third target edge that is also horizontal is selected, such that the first target edge is paired with each third target edge that is horizontal to result in one or more corresponding second target edge pairs. Similarly, where the first target edge is vertical, each third target edge that is also vertical is selected, such that the first target edge is paired with each third target edge that is vertical to result in one or more corresponding second target edge pairs. Each second target edge pair relates to a manufacturing gap penalty incurred in manufacturing the lithographic mask due to a gap between the edges of the second target edge pair.

Third, a number of third target edge pairs can be selected. Each third target edge pair includes one of the first target edges and one of the third target edges. Selecting the third target edge pairs is achieved as follows, for each first target edge. Where the first target edge is horizontal, each third target edge that is vertical is selected, such that the first target edge is paired with each third target edge that is vertical to result in one or more corresponding third target edge pairs. Similarly, where the first target edge is vertical, each third target edge that is horizontal is selected, such that the first target edge is paired with each third target edge that is horizontal to result in one or more corresponding third target edge pairs. Each third target edge pair relates to a manufacturing crossing penalty incurred in manufacturing the lithographic mask due to a potential crossing between the edges of the third target edge pair.

Embodiments of the invention provide for certain advantages. In particular, by purposefully selecting the number of target edge pairs on which basis the manufacturing penalty of the lithographic mask is determined, the manufacturing penalty—and hence the manufacturability of the lithographic mask itself—are determined more easily. That is, the computational volume (i.e., how much processing power and/or the length of time of such processing) in determining the manufacturing penalty in making the lithographic mask is reduced. This easier and less complex manufacturing penalty determination renders the manufacturability determination to be a more tractable problem, whereas prior to the improvements provided by embodiments of the invention, solving this problem could potentially be very intractable, if not impossible.

Still other aspects, advantages, and embodiments of the invention will become apparent by reading the detailed description that follows, and by referring to the following drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIGS. 5A, 5B, and 5C are diagrams depicting how three different sets of target edges are selected, according to an embodiment of the invention.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Technical Background and Overview

Figure 1A:
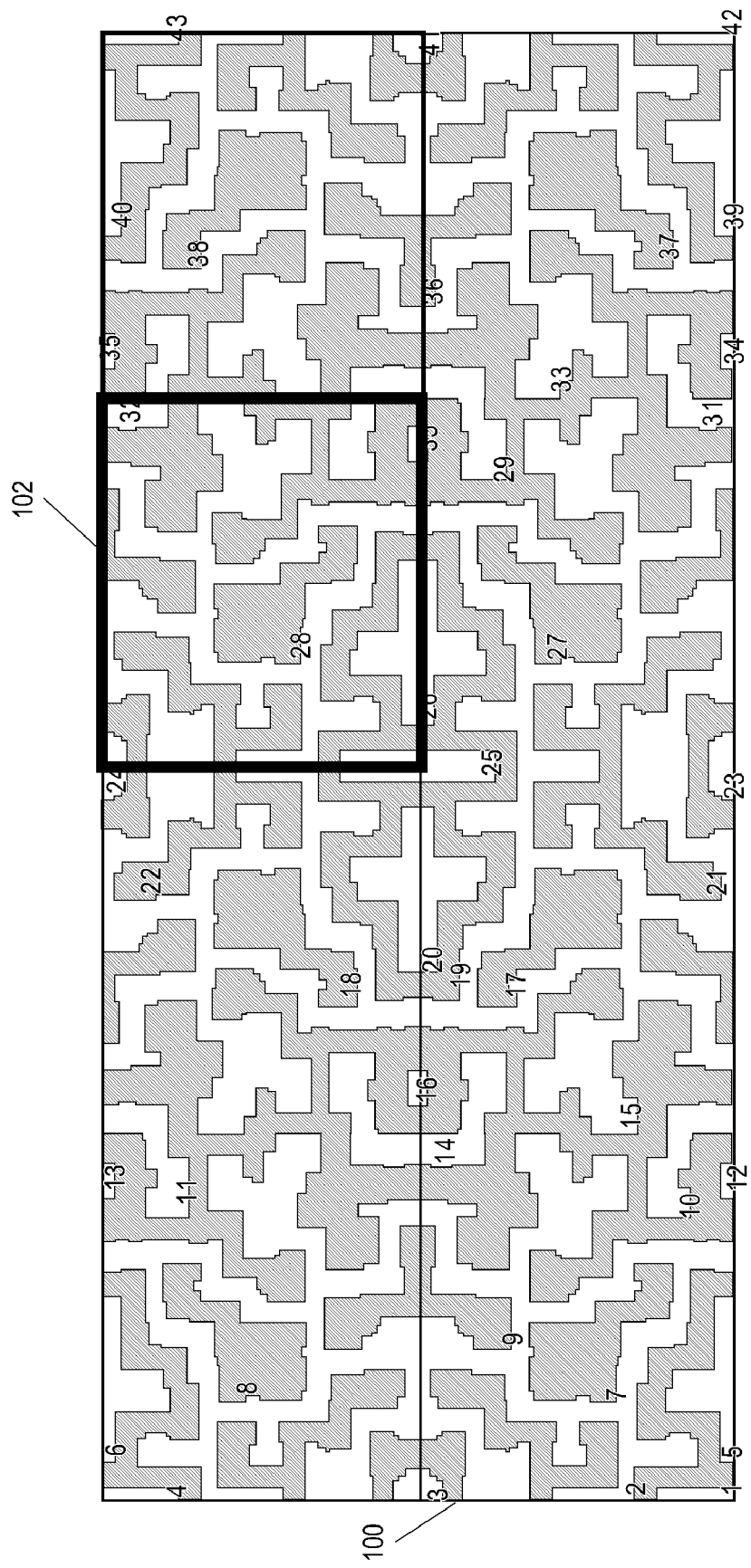
FIG. 1A is a diagram of a representative lithographic mask layout, according to an embodiment of the invention.
Figure 1B:
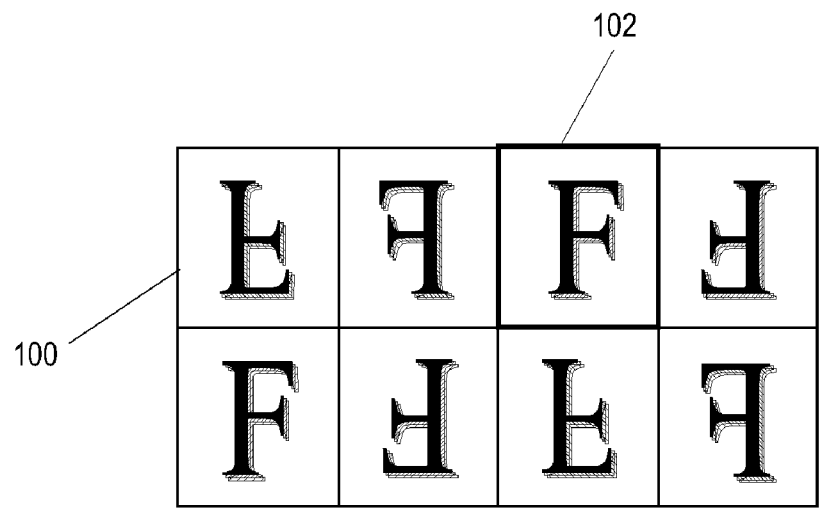
FIG. 1B is a diagram depicting the symmetry of the layout of FIG. 1A, according to an embodiment of the invention.
Figure 1C:
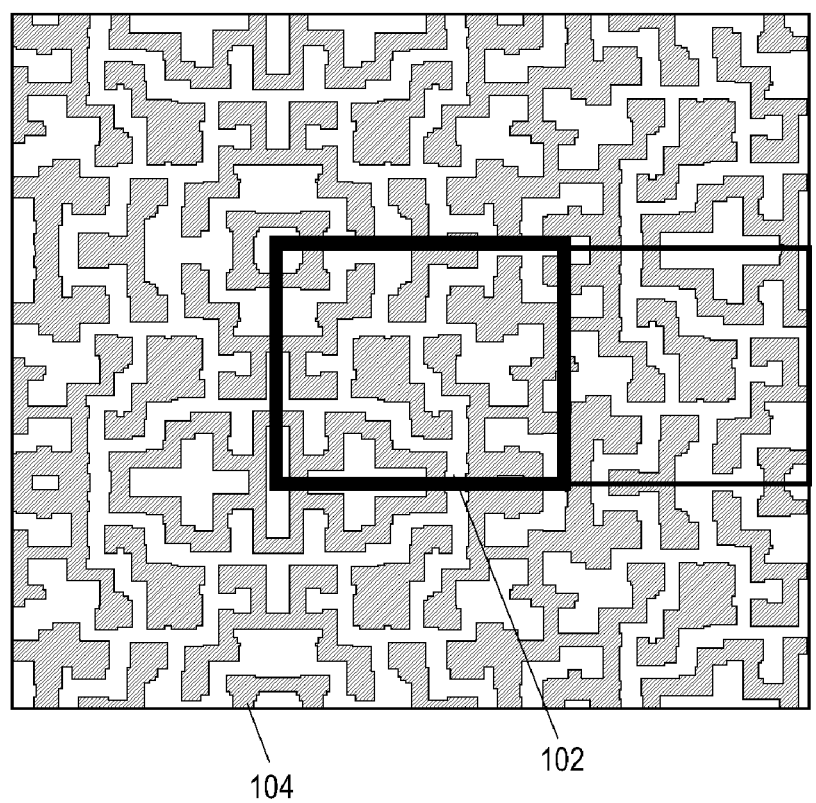
FIG. 1C is a diagram depicting the replication of a cell of the layout of FIG. 1A, according to an embodiment of the invention.

FIG. 1A shows a representative lithographic mask layout 100, according to an embodiment of the invention. The lithographic mask layout 100 includes a cell 102 that is symmetrically duplicated throughout the layout 100. In particular, FIG. 1B shows the symmetry of the cell 102 within the lithographic mask layout 100, according to an embodiment of the invention. The letter F is used in FIG. 1B to denote the cell 102 in the layout 100 of FIG. 1A, and the various iterations of the letter F in FIG. 1B show how the cell 102 is symmetrically duplicated throughout the layout 100 in FIG. 1A. The symmetry in FIG. 1B can be referred to as a staggered symmetry. To assess the manufacturability of the lithographic mask layout 100, particularly at the boundaries of the cell 102, the mask layout data underlying the layout 100 is replicated over n-by-n units, where n may be equal to three. For instance, FIG. 1C shows such a replication 104 based on the cell 102, according to an embodiment of the invention.

Figure 2:
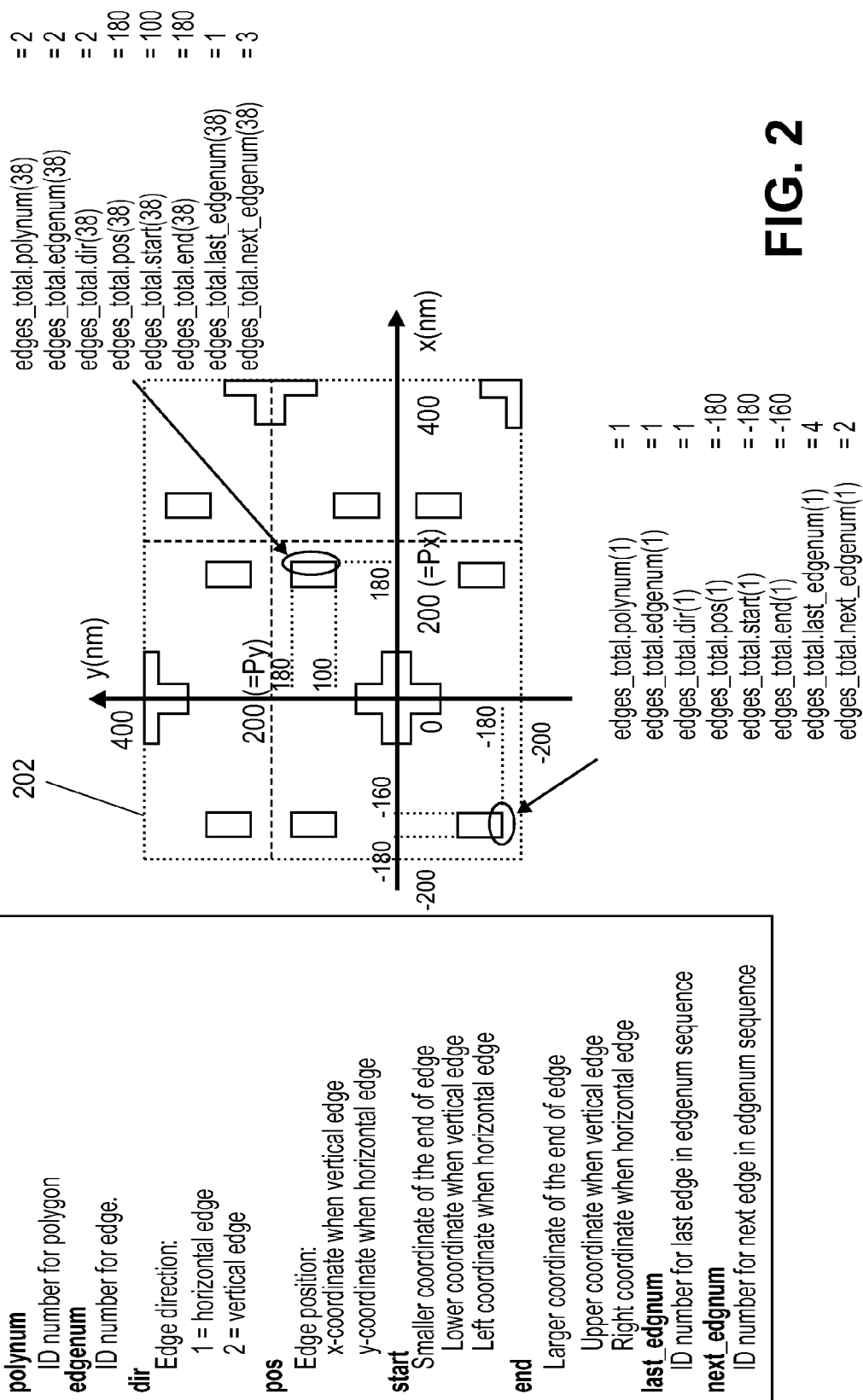
FIG. 2 is a diagram depicting representative mask layout data for a portion of a lithographic mask layout, according to an embodiment of the invention.

FIG. 2 shows representative mask layout data for a portion 202 of the lithographic mask layout 100, according to an embodiment of the invention. It is noted that the lithographic mask layout 100 includes a number of polygons. Each polygon has a number of edges. An edge pair is defined as a pair of different edges, of the same or different polygons. For example, an edge pair may include two different edges of the same polygon, or an edge pair may include two edges of different polygons.

Furthermore, each edge of each polygon can have a number of attributes: polynum, edgenum, dir, pos, start, end, last_edgenum, and next_edgenum. Polynum is the identification for of the polygon to which the edge in question belongs. Edgenum is the identification of the edge in question within this polygon. Dir is the edge direction, where a first value, like one, may specify the horizontal direction, and a second value, like two, may specify the vertical direction. Pos is the edge position, including the x-coordinate for a vertical edge and a y-coordinate for a horizontal hedge. Start is the smaller coordinate of the end of the edge, which is the lower coordinate for a vertical edge, and the left coordinate for a horizontal edge. End is the larger coordinate of the end of the edge, which is the upper coordinate for a vertical edge, and the right coordinate for a horizontal edge. Last_edgenum is the identification number of the previously connected edge within the same polygon, in a prespecified direction (i.e., clockwise or counter-clockwise). Similarly, next_edgenum is the identification number of the next connected edge within the same polygon, in the prespecified direction.

Figure 3A:
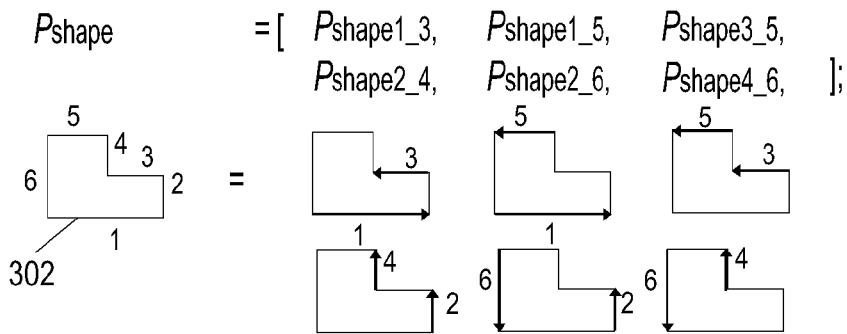
FIGS. 3A, 3B, and 3C are diagrams representing three different types of manufacturing penalties that can occur when determining the manufacturability of a lithographic mask, according to an embodiment of the invention.
Figure 3B:
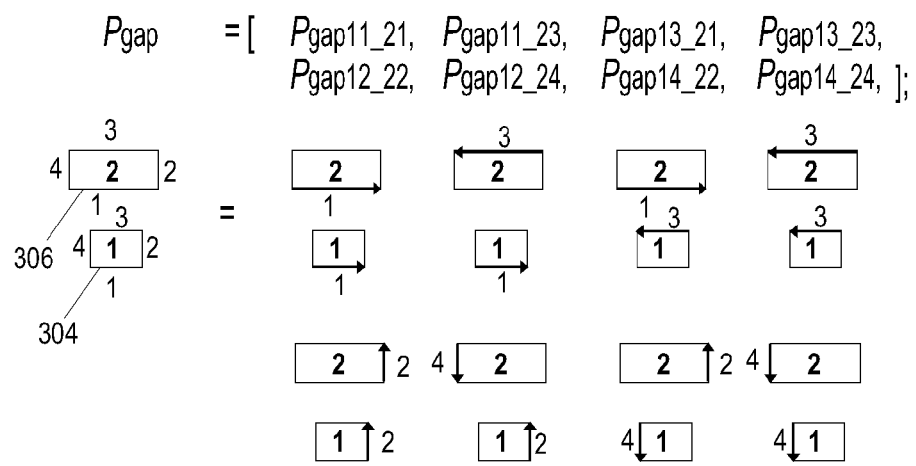
Figure 3C:
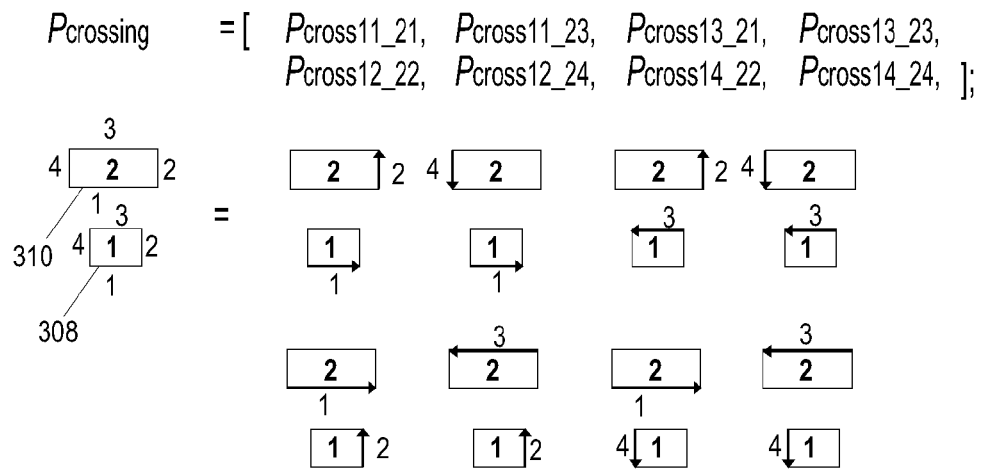

FIGS. 3A, 3B, and 3C represent three different types of manufacturing penalties that can occur when determining the manufacturability of a lithographic mask, according to varying embodiments of the invention. FIG. 3A particularly shows a penalty for the shape of a single polygon, which is referred to as a shape penalty. FIG. 3B particularly shows a penalty for the gap between two different polygons, which is referred to as a gap penalty. FIG. 3C particularly shows a penalty for crossing edges between two different polygons, which is referred to as a crossing penalty.

In FIG. 3A, the polygon 302 has six edges. Each different pair of parallel edges within this polygon 302 makes up a target edge pair that represents a corresponding shape penalty for the polygon 302, as depicted on the right-hand side of FIG. 3A. In FIG. 3B, the polygons 304 and 306 each has four edges. Each different pair of parallel edges of the polygons 304 and 306 (i.e., with one edge from the polygon 304 and one edge from the polygon 306) makes up a target edge pair that represents a corresponding gap penalty for the two polygons 304 and 306, as depicted on the right-hand side of FIG. 3B. In FIG. 3C, the polygons 308 and 310 each has four edges. Each different pair of non-parallel, or crossing, edges of the polygons 308 and 310 (i.e., with one edge from the polygon 308 and one edge from the polygon 310) makes up a target edge pair that represents a corresponding crossing penalty for the two polygons 308 and 310.

A shape penalty is a manufacturing penalty incurred in manufacturing the lithographic mask due to the shape of a single polygon, owing to the difficulty in making the shape. Thus, a target edge pair can define the two edges of a given polygon that represent a shape penalty. A gap penalty is a manufacturing penalty incurred in manufacturing the lithographic mask due to the gap between the two edges of two different polygons, owing to the difficulty in maintaining this gap. Thus, a target edge pair can define the two edges of two different polygons that represent a gap penalty. A crossing penalty is a manufacturing penalty incurred in manufacturing the lithographic mask due to the potential for overlapped edges by two different polygons and a bow tie shape of one polygon, owing to the difficulty in insuring that such shapes do not occur. Thus, a target edge pair can define the horizontal and vertical edges that represent a crossing penalty.

Figure 4:
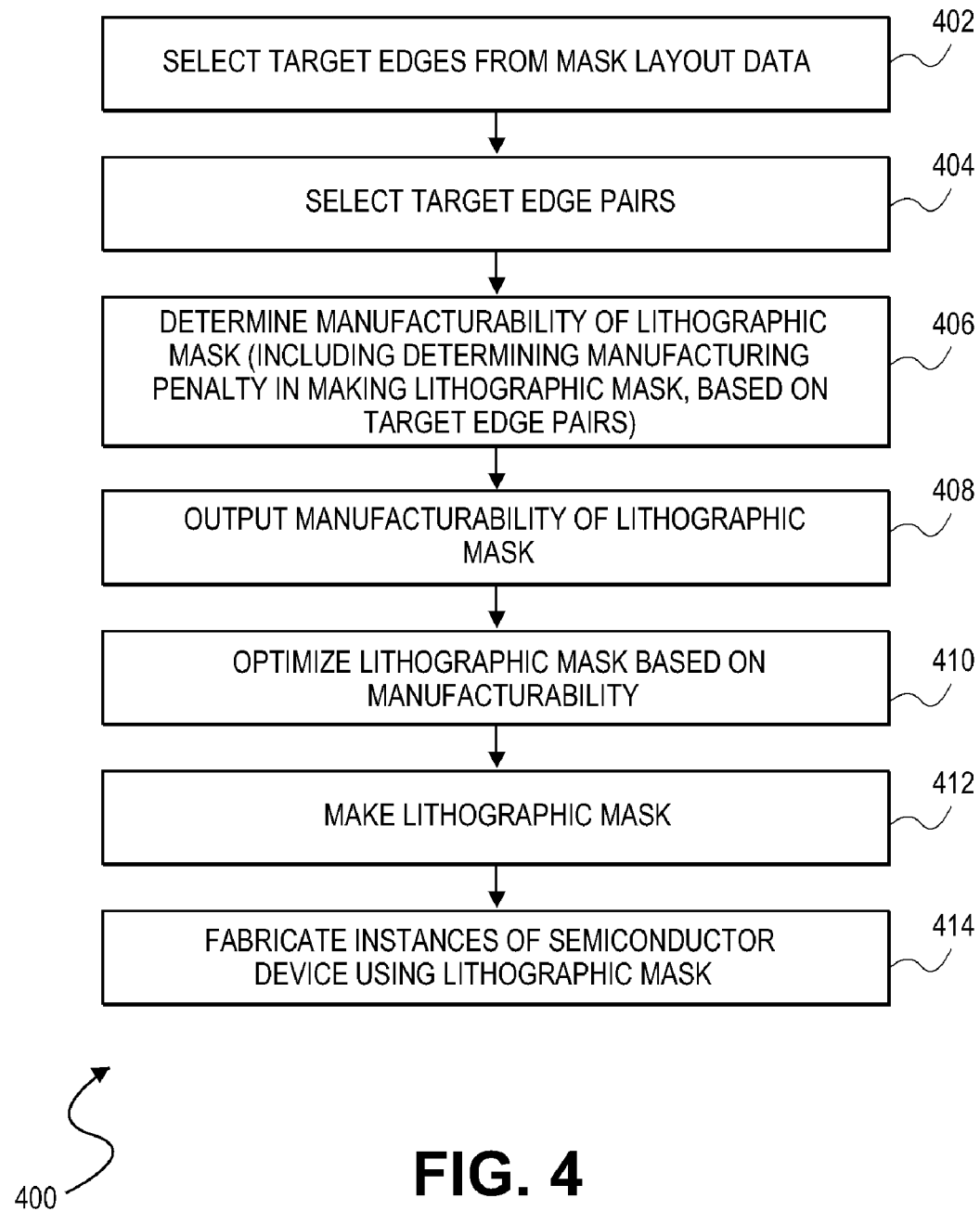
FIG. 4 is a flowchart of a method, according to an embodiment of the invention.

FIG. 4 shows a method 400 for determining the manufacturability of a lithographic mask used to fabricate instances of a semiconductor device, according to an embodiment of the invention. Target edges are selected from mask layout data representing a lithographic mask (402). Thereafter, target edge pairs are selected (404). The target edge pairs are selected to represent each potential instance of a manufacturing penalty, such as a shape penalty, a gap penalty, or a crossing penalty. That is, in at least some embodiments, target edge pairs are identified in part 402 that represent all potential instances of manufacturing penalties like shape, gap, and crossing penalties. It is noted that the potential number of all target edge pairs is relatively large, and increases explosively on a cell-by-cell basis, such as the cell 102 of FIG. 1C that has been described. As such, the method 400 is purposeful in how it selects target edge pairs in part 404 of FIG. 4.

Thereafter, the manufacturability of the lithographic mask is determined (406), which includes determining the manufacturing penalty in making the lithographic mask, based on the target edge pairs. The manufacturing penalty in making the lithographic mask can include the shape, gap, and crossing penalties that have been described. By purposefully selecting the number of target edge pairs in part 404 that are considered in making the determinations in part 406, the complexity of these determination is reduced, and rendered more tractable.

Once the manufacturability of the lithographic mask has been determined, it is output (408). For instance, the manufacturability may be displayed on a display device of a computer for viewing by a user. The method 400 of FIG. 4, including at least parts 402, 404, 406, and 408, may be performed by one or more computer programs, which may be executed by one or more processors of one or more computer devices, as can be appreciated by those of ordinary skill within the art.

Ultimately, the lithographic mask may have its design optimized, based on the manufacturability determine, so that it is in fact easier to manufacture (410). In this respect, parts 402, 404, 406, 408, and 410 of the method 400 may be iteratively performed until a lithographic mask having a desired manufacturability difficulty has been achieved. Embodiments of the invention are not limited to the specific manner by which the manufacturability of the lithographic mask and the manufacturing penalty in making the lithographic mask is determined in part 406 and/or how the lithographic mask is optimized in part 410. It is noted that in at least some embodiments, part 406 may be considered as being implicitly performed as part of the optimization of part 410.

For example, in one embodiment, the approach described in the above-referenced patent application entitled "determining manufacturability of lithographic mask using continuous derivatives characterizing the manufacturability on a continuous scale," can be employed to optimize the lithographic mask, including determining the manufacturability of the mask and the manufacturing penalty in making the mask. In this approach, minimizing the manufacturability penalty of the lithographic mask is objective of nonlinear programming. The mask layout data are set as variables and frequency domain values are set as constraints. Then a nonlinear programming is solved to actually get the optimized lithographic mask in manufacturability. Once a final design for the lithographic mask has been approved, the lithographic mask may be made (412), and instance of a semiconductor device fabricated using the lithographic mask (414).

Thus, embodiments of the invention advantageously provide for purposefully selecting the number of target edge pairs that are used in assessing the manufacturability of a lithographic mask. By attempting to minimize the number of target edge pairs, determining the mask's manufacturability is more easily and more quickly achieved. Subsequent sections of the detailed description present three different manners by which the number of target edge pairs can be purposefully selected in accordance with various embodiments of the invention. It is noted that these three approaches can be used individually or together. However, first, how target edges are themselves selected is described, where the target edge pairs are thereafter selected from these target edges.

Selecting Target Edges

FIGS. 5A, 5B, and 5C illustratively depict three different sets of target edges that are selected in part 402 of FIG. 4, according to an embodiment of the invention. The mask layout data includes polygons that are divided over a number of different cells. The cells include a center cell 502, two vertical cells 504A and 504B that are collectively referred to as the vertical cells 504, and two horizontal cells 506A and 506B that are collectively referred to as the horizontal cells 506. The vertical cell 504A is an upper cell above the center cell 502, while the vertical cell 504B is a lower cell below the center cell 502. The horizontal cell 506A is a right cell to the right of the center cell 502, while the horizontal cell 506B is a left cell to the left of the center cell 502.

In FIG. 5A, first target edges are selected as the edges that are located at least partially within the center cell 502. These target edges are shown in a bold manner in FIG. 5A. It is noted that an edge does not necessarily have to be completely within the center cell 502 to be selected as a first target edge. Rather, an edge just has to be at least partially within the center cell 502 to be selected as a first target edge. An edge is at least partially within a given cell if at least a part of an edge is within the given cell in question.

In FIG. 5B, second target edges are selected as the edges that are at least partially within the center cell 502, the vertical cells 504, or the horizontal cells 506 and that are part of polygons located at least partially within the center cell 502. These target edges are shown in a bold manner in FIG. 5B. It is noted that an edge does not have to even be partially within the center cell 502 to be selected as a second target edge. Rather, an edge just had to be part of a polygon that is at least partially within the center cell to be selected as a second target edge, and the edge itself has to be at least partially within the center cell 502, the vertical cells 504, or the horizontal cells 506. A polygon is at least partially within a given cell if at least a part of an edge of the polygon is within the given cell in question.

In FIG. 5C, third target edges are selected as the edges that are at least partially within the center cell 502, the vertical cells 504, or the horizontal cells 506 and that are part of polygons located are at least partially within the center cell 502, the vertical cells 504, or the horizontal cells 506. These target edges are shown in a bold manner in FIG. 5C. It is noted that the difference between the second target edges of FIG. 5B and the third target edges of FIG. 5B is that the former edges have to be part of a polygon that is at least partially within the center cell 502, whereas the latter edges just have to be part of a polygon that is at least partially within the center cell 502, the vertical cells 504, or the horizontal cells 506.

For example, there are two vertical edges in the horizontal cell 506B that are third target edges in FIG. 5C but that are not second target edges in FIG. 5B. This is because these vertical edges are part of a polygon that is at least partially within the horizontal cell 506B (and are indeed completely within the cell 506B). As such, they are selected as third target edges, but are not selected as second target edges. In general, the third target edges of FIG. 5C include all of the second target edges of FIG. 5B, and the second target edges of FIG. 5B include all of the first target edges of FIG. 5A.

Furthermore, the set of first target edges of FIG. 5A can be expressed as $S_{h1} \cup S_{v1}$, where $S_{h1}$ is the set of all the first target edges that are horizontal, and $S_{v1}$ is the set of all first target edges that are vertical. Likewise, the set of second target edges of FIG. 5B can be expressed as $S_{h2} \cup S_{v2}$, where $S_{h2}$ is the set of all the second target edges that are horizontal, and $S_{v2}$ is the set of all second target edges that are vertical. Similarly, the set of third target edges of FIG. 5C can be expressed as $S_{h3} \cup S_{v3}$, where $S_{h3}$ is the set of all the second target edges that are horizontal, and $S_{v3}$ is the set of all second target edges that are vertical.

Selecting First Target Edge Pairs Representing Manufacturing Shape Penalties

Figure 6A:
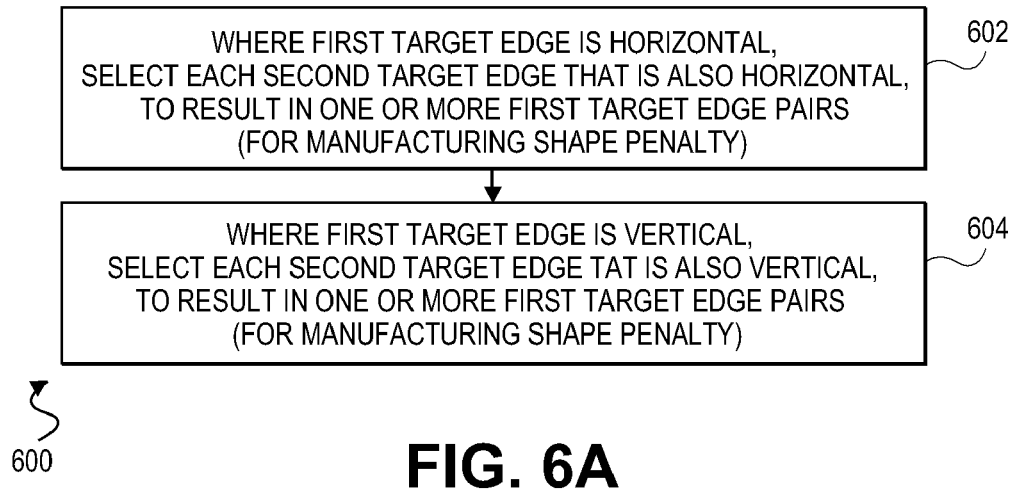
FIGS. 6A, 6B, and 6C are flowcharts of method for selecting target edge pairs representing the three different types of manufacturing penalties of FIGS. 3A, 3B, and 3C according to varying embodiments of the invention.

FIG. 6A shows a method 600 that is performed for each first target edge of FIG. 5A to select first target edge pairs that represent manufacturing shape penalties, such as has been described in relation to FIG. 3A, according to an embodiment of the invention. Where the first target edge in question is horizontal, each second target edge of FIG. 5B that is also horizontal (and that is part of the same polygon) is selected (602), to result in one or more first target edge pairs. Likewise, where the first target edge in question is vertical, each second target edge of FIG. 5B that is also vertical (and that is part of the same polygon) is selected (604), to result in one or more first target edge pairs.

Thus, each first target edge pair includes a first target edge of FIG. 5A and a second target edge of FIG. 5B having the same direction, and that are part of the same polygon. That is, the two target edges of each target edge pair are both horizontal or are both vertical. Each target edge pair relates to a manufacturing shape penalty incurred in manufacturing the lithographic mask due to a shape of a polygon including one or more of the edges of the target edge pair in question (i.e., to maintain this shape, for instance).

Each first target edge pair having target edges that are horizontal can be expressed as $P_{shape\_hor} = P(i, j)$ $i \in S_{h1}$, $j \in S_{h2}$, subject to the constraint that the edges i and j are part of the same polygon. Likewise, each first target edge pair having target edges that are vertical can be expressed as $P_{shape\_ver} = P(i, j)$ $i \in S_{v1}$, $j \in S_{v2}$, also subject to the constrain that the edges i and j are part of the same polygon. Thus, the set of all the first target edge pairs encompasses all the target edge pairs $P_{shape\_hor}$ and $P_{shape\_ver}$.

Selecting Second Target Edge Pairs Representing Manufacturing Gap Penalties

Figure 6B:
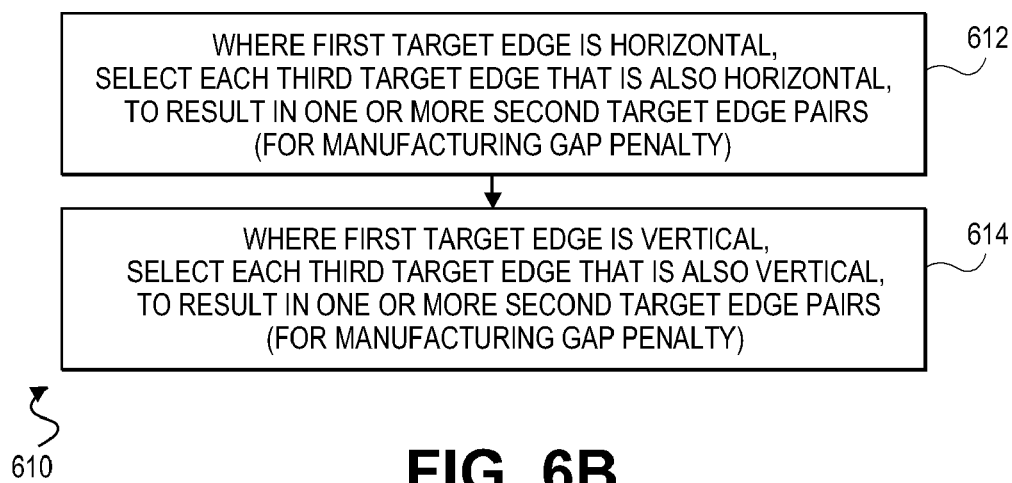

FIG. 6B shows a method 610 that is performed for each first target edge of FIG. 5A to select second target edge pairs that represent manufacturing gap penalties, such as has been described in relation to FIG. 3B, according to an embodiment of the invention. Where the first target edge in question is horizontal, each third target edge of FIG. 5C that is also horizontal (but that is part of a different polygon) is selected (612), to result in one or more second target edge pairs. Likewise, when the first target edge in question is vertical, each third target edge of FIG. 5C that is also vertical (but that is part of a different polygon) is selected (614), to result in one or more second target edge pairs.

Thus, each second target edge pair includes a first target edge of FIG. 5A and a third target edge of FIG. 5C having the same direction, and that are part of different polygons. That is, the two target edges of each target edge pair are both horizontal or are both vertical. Each target edge pair relates to a manufacturing gap penalty incurred in manufacturing the lithographic mask due to a gap between the edges of the target edge pair in question (i.e., to maintain this gap, for instance).

Each second target edge pair having target edges that are horizontal can be expressed as $P_{gap\_hor} = P(i, j)$ $i \in S_{h1}$, $j \in S_{h3}$, subject to the constraint that the edges i and j are part of different polygons (and not the same polygon). Likewise, each second target edge pair having target edges that are vertical can be expressed as $P_{gap\_ver} = P(i, j)$ $i \in S_{v1}$, $j \in S_{v3}$, also subject to the constraint that the edges i and j are part of different polygons (and not the same polygon). Thus, the set of all the first target edge pairs encompasses all the target edge pairs $P_{gap\_hor}$ and $P_{gap\_ver}$.

Selecting Third Target Edge Pairs Representing Manufacturing Crossing Penalties

Figure 6C:
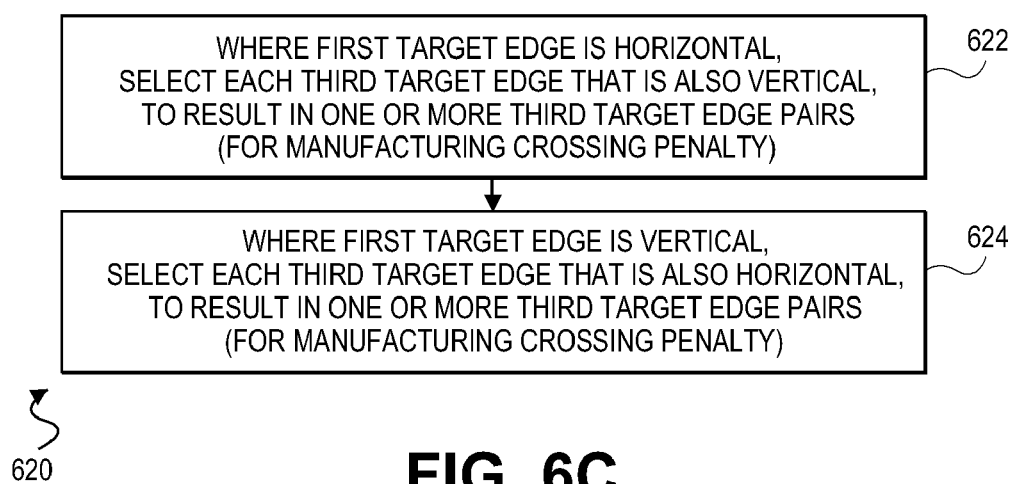

FIG. 6C shows a method 620 that is performed for each target edge of FIG. 5A to select third target edge pairs that represent manufacturing crossing penalties, such as has been described in relation to FIG. 3C, according to an embodiment of the invention. Where the first target edge in question is horizontal, each third target edge of FIG. 5C that is vertical (and that is part of a different polygon) is selected (622), to result in one or more third target edge pairs. Likewise, when the first target edge in question is vertical, each third target edge of FIG. 5C that is horizontal (and that is part of a different polygon) is selected (624), to result in one or more third target edge pairs.

Thus, each third target edge pairs includes a first target edge of FIG. 5A and a third target edge of FIG. 5C having different directions, and that are part of different polygons. That is, if one of the target edges of each target edge pair is horizontal, then the other target edge of the target edge pair is vertical. Each target edge pair relates to a manufacturing crossing penalty incurred in manufacturing the lithographic mask due to a potential crossing between the edges of the selected target edge pair in question.

Each third target edge pair having a first target edge that is horizontal can be expressed as $P_{crossing\_hor}=P(i, j)$ $i \in S_{h1}$, $j \in S_{v3}$, subject to the constraint that the edges i and j are part of different polygons (and not the same polygon). Likewise, each third target edge pair having a first target edge that is vertical can be expressed as $P_{crossing\_ver}=P(i, j)$ $i \in S_{v1}$, $j \in S_{h3}$, also subject to the constraint that the edges i and j are part of different polygons (and not the same polygon). Thus, the set of all the third target edge pairs encompasses all the target edge pairs $P_{crossing\_hor}$ and $P_{crossing\_ver}$.

CONCLUSION

It is noted that, although specific embodiments have been illustrated and described herein, it will be appreciated by those of ordinary skill in the art that any arrangement calculated to achieve the same purpose may be substituted for the specific embodiments shown. This application is intended to cover any adaptations or variations of embodiments of the present invention. For example, a write-back cache may or may not be employed. Therefore, it is manifestly intended that this invention be limited only by the claims and equivalents thereof.

We claim:

1. A method for determining manufacturability of a lithographic mask employed in fabricating instances of a semiconductor device, comprising:

selecting a plurality of target edges from mask layout data of the lithographic mask, the mask layout data comprising a plurality of polygons distributed over a plurality of cells, each polygon having a plurality of edges, the cells comprising a center cell, two vertical cells including an upper cell above the center cell and a lower cell below the center cell, and two horizontal cells including a left cell to a left of the center cell and a right cell to a right of the center cell, where selecting the target edges comprises:

selecting a plurality of first target edges as the edges located at least partially within the center cell;

selecting a plurality of second target edges as the edges that are at least partially within the center cell, the vertical cells, or the horizontal cells and that are part of polygons located at least partially within the center cell;

selecting a plurality of third target edges as the edges that are at least partially within the center cell, the vertical cells, or the horizontal cells and that are part of polygons located at least partially within the center cell, the vertical cells, or the horizontal cells;

selecting a number of target edge pairs for determining a manufacturing penalty in making the lithographic mask, the target edge pairs selected in a manner that decreases computational volume in determining the manufacturing penalty in making the lithographic mask, each target edge pair including a first edge selected from the first target edges and a second edge selected from the second target edges or the third target edges;

determining the manufacturability of the lithographic mask, by a computer, including determining the manufacturing penalty in making the lithographic mask, where determining the manufacturing penalty is based on the target edge pairs as selected; and, outputting the manufacturability of the lithographic mask in the manufacturability, by the computer, where the manufacturability of the lithographic mask is dependent on the manufacturing penalty in making the lithographic mask.

2. The method of claim 1, wherein selecting the target edge pairs comprises selecting a plurality of selected target edge pairs, each selected target edge pair including one of the first target edges and one of the second target edges, wherein selecting the selected target edge pairs comprises:

for each first target edge, where the first target edge is horizontal, selecting each second target edge that is horizontal, such that the first target edge is paired with each second target edge that is horizontal to result in one or more corresponding selected target edge pairs;

where the first target edge is vertical, selecting each second target edge that is vertical, such that the first target edge is paired with each second target edge that is vertical to result in one or more corresponding selected target edge pairs, wherein each selected target edge pair relates to a manufacturing shape penalty incurred in manufacturing the lithographic mask due to a shape of a polygon including one or more of the edges of the selected target edge pair.

3. The method of claim 1, wherein selecting the target edge pairs comprises selecting a plurality of selected target edge pairs, each selected target edge pair including one of the first target edges and one of the third target edges, wherein selecting the selected target edge pairs comprises:

for each first target edge, where the first target edge is horizontal, selecting each third target edge that is horizontal, such that the first target edge is paired with each third target edge that is horizontal to result in one or more corresponding selected target edge pairs;

where the first target edge is vertical, selecting each third target edge that is vertical, such that the first target edge is paired with each third target edge that is vertical to result in one or more corresponding selected target edge pairs, wherein each selected target edge pair relates to a manufacturing gap penalty incurred in manufacturing the lithographic mask due to a gap between the edges of the selected target edge pair.

4. The method of claim 1, wherein selecting the target edge pairs comprises selecting a plurality of selected target edge pairs, each selected target edge pair including one of the first target edges and one of the third target edges, wherein selecting the selected target edge pairs comprises:

for each first target edge, where the first target edge is horizontal, selecting each third target edge that is vertical, such that the first target edge is paired with each third target edge that is vertical to result in one or more corresponding selected target edge pairs;

where the first target edge is vertical, selecting each third target edge that is horizontal, such that the first target edge is paired with each third target edge that is horizontal to result in one or more corresponding selected target edge pairs, wherein each selected target edge pair relates to a manufacturing crossing penalty incurred in manufacturing the lithographic mask due to a potential crossing between the edges of the selected target edge pair.

5. The method of claim 1, further comprising optimizing the lithographic mask based on the manufacturability of the lithographic mask determined and based on the manufacturing penalty determined.

6. The method of claim 1, further comprising making the lithographic mask.

7. The method of claim 6, further comprising fabricating the instances of the semiconductor device using the lithographic mask.

8. The method of claim 1, wherein outputting the manufacturability of the lithographic mask comprises displaying the manufacturability of the lithographic mask for viewing by a user.

9. An article of manufacture tangibly embodying computer readable non-transitory instructions which, when implemented, cause a computer device to carry out the steps of a method according to claim 1.

10. A method for determining manufacturability of a lithographic mask employed in fabricating instances of a semiconductor device, comprising:
    selecting a plurality of target edges from mask layout data of the lithographic mask, the mask layout data comprising a plurality of polygons distributed over a plurality of cells, each polygon having a plurality of edges, the cells comprising a center cell, two vertical cells including an upper cell above the center cell and a lower cell below the center cell, and two horizontal cells including a left cell to a left of the center cell and a right cell to a right of the center cell,
    where selecting the target edges comprises:
        selecting a plurality of first target edges as the edges located at least partially within the center cell;
        selecting a plurality of second target edges as the edges that are at least partially within the center cell, the vertical cells, or the horizontal cells and that are part of polygons located at least partially within the center cell;
        selecting a plurality of third target edges as the edges that are at least partially within the center cell, the vertical cells, or the horizontal cells and that are part of polygons located at least partially within the center cell, the vertical cells, or the horizontal cells;
    selecting a number of target edge pairs for determining a manufacturing penalty in making the lithographic mask, by performing one or more of:
        (a) selecting a plurality of first target edge pairs, each first target edge pair including one of the first target edges and one of the third target edges, wherein selecting the first target edge pairs comprises:
            for each first target edge,
                where the first target edge is horizontal, selecting each second target edge that is horizontal, such that the first target edge is paired with each second target edge that is horizontal to result in one or more corresponding first target edge pairs;
                where the first target edge is vertical, selecting each second target edge that is vertical, such that the first target edge is paired with each second target edge that is vertical to result in one or more corresponding first target edge pairs,
            wherein each first target edge pair relates to a manufacturing shape penalty incurred in manufacturing the lithographic mask due to a shape of a polygon including one or more of the edges of the first target edge pair;
        (b) selecting a plurality of second target edge pairs, each second target edge pair including one of the first target edges and one of the third target edges, wherein selecting the second target edge pairs comprises:
            for each first target edge,
                where the first target edge is horizontal, selecting each third target edge that is horizontal, such that the first target edge is paired with each third target edge that is horizontal to result in one or more corresponding second target edge pairs;
                where the first target edge is vertical, selecting each third target edge that is vertical, such that the first target edge is paired with each third target edge that is vertical to result in one or more corresponding second target edge pairs,
            wherein each second target edge pair relates to a manufacturing gap penalty incurred in manufacturing the lithographic mask due to a gap between the edges of the second target edge pair;
        (c) selecting a plurality of third target edge pairs, each third target edge pair including one of the first target edges and one of the third target edges, wherein selecting the third target edge pairs comprises:
            for each first target edge,
                where the first target edge is horizontal, selecting each third target edge that is vertical, such that the first target edge is paired with each third target edge that is vertical to result in one or more corresponding third target edge pairs;
                where the first target edge is vertical, selecting each third target edge that is horizontal, such that the first target edge is paired with each third target edge that is horizontal to result in one or more corresponding third target edge pairs,
            wherein each third target edge pair relates to a manufacturing crossing penalty incurred in manufacturing the lithographic mask due to a potential crossing between the edges of the third target edge pair; and,
    determining the manufacturability of the lithographic mask, by a computer, including determining the manufacturing penalty in making the lithographic mask, where determining the manufacturing penalty is based on the target edge pairs as selected.

11. The method of claim 10, further comprising outputting the manufacturability of the lithographic mask, where the manufacturability of the lithographic mask is dependent on the manufacturing penalty in making the lithographic mask.

12. The method of claim 11, wherein outputting the manufacturability of the lithographic mask comprises displaying the manufacturability of the lithographic mask for viewing by a user.

13. The method of claim 10, further comprising optimizing the lithographic mask based on the manufacturability of the lithographic mask determined and based on the manufacturing penalty determined.

14. An article of manufacture tangibly embodying computer readable non-transitory instructions which, when implemented, cause a computer device to carry out the steps of a method according to claim 10.

15. A method for determining manufacturability of a lithographic mask employed in fabricating instances of a semiconductor device, comprising:
    selecting a plurality of target edges from mask layout data of the lithographic mask, the mask layout data comprising a plurality of polygons distributed over a plurality of cells, each polygon having a plurality of edges, the cells comprising a center cell, two vertical cells including an upper cell above the center cell and a lower cell below the center cell, and two horizontal cells including a left cell to a left of the center cell and a right cell to a right of the center cell,
    where selecting the target edges comprises:
        selecting a plurality of first target edges as the edges located at least partially within the center cell;

selecting a plurality of second target edges as the edges that are at least partially within the center cell, the vertical cells, or the horizontal cells and that are part of polygons located at least partially within the center cell;

selecting a plurality of third target edges as the edges that are at least partially within the center cell, the vertical cells, or the horizontal cells and that are part of polygons located at least partially within the center cell, the vertical cells, or the horizontal cells;

selecting a number of target edge pairs for determining a manufacturing penalty, by performing:

(a) selecting a plurality of first target edge pairs, each first target edge pair including one of the first target edges and one of the third target edges, wherein selecting the first target edge pairs comprises:

for each first target edge,
where the first target edge is horizontal, selecting each second target edge that is horizontal, such that the first target edge is paired with each second target edge that is horizontal to result in one or more corresponding first target edge pairs;
where the first target edge is vertical, selecting each second target edge that is vertical, such that the first target edge is paired with each second target edge that is vertical to result in one or more corresponding first target edge pairs,
wherein each first target edge pair relates to a manufacturing shape penalty incurred in manufacturing the lithographic mask due to a shape of a polygon including one or more of the edges of the first target edge pair;

(b) selecting a plurality of second target edge pairs, each second target edge pair including one of the first target edges and one of the third target edges, wherein selecting the second target edge pairs comprises:

for each first target edge,
where the first target edge is horizontal, selecting each third target edge that is horizontal, such that the first target edge is paired with each third target edge that is horizontal to result in one or more corresponding second target edge pairs;
where the first target edge is vertical, selecting each third target edge that is vertical, such that the first target edge is paired with each third target edge that is vertical to result in one or more corresponding second target edge pairs,
wherein each second target edge pair relates to a manufacturing gap penalty incurred in manufacturing the lithographic mask due to a gap between the edges of the second target edge pair;

(c) selecting a plurality of third target edge pairs, each third target edge pair including one of the first target edges and one of the third target edges, wherein selecting the third target edge pairs comprises:

for each first target edge,
where the first target edge is horizontal, selecting each third target edge that is vertical, such that the first target edge is paired with each third target edge that is vertical to result in one or more corresponding third target edge pairs;
where the first target edge is vertical, selecting each third target edge that is horizontal, such that the first target edge is paired with each third target edge that is horizontal to result in one or more corresponding third target edge pairs,
wherein each third target edge pair relates to a manufacturing crossing penalty incurred in manufacturing the lithographic mask due to a potential crossing between the edges of the third target edge pair; and, determining the manufacturability of the lithographic mask, by a computer, including determining the manufacturing penalty in making the lithographic mask, where determining the manufacturing penalty is based on the target edge pairs as selected.

16. The method of claim 15, further comprising outputting the manufacturability of the lithographic mask, where the manufacturability of the lithographic mask is dependent on the manufacturing penalty in making the lithographic mask.

17. The method of claim 16, wherein outputting the manufacturability of the lithographic mask comprises displaying the manufacturability of the lithographic mask for viewing by a user.

18. The method of claim 15, further comprising optimizing the lithographic mask based on the manufacturability of the lithographic mask determined and based on the manufacturing penalty determined.

19. An article of manufacture tangibly embodying computer readable non-transitory instructions which, when implemented, cause a computer device to carry out the steps of a method according to claim 15.

* * * * *